US008564588B2

(12) United States Patent
Hwang et al.

(10) Patent No.: US 8,564,588 B2
(45) Date of Patent: Oct. 22, 2013

(54) INTERFACE APPARATUS AND METHOD THEREOF

(75) Inventors: Hyun Ha Hwang, Kangnam-gu (KR); Han Young Hong, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 817 days.

(21) Appl. No.: 12/282,295

(22) PCT Filed: Mar. 9, 2007

(86) PCT No.: PCT/KR2007/001176
§ 371 (c)(1), (2), (4) Date: Sep. 9, 2008

(87) PCT Pub. No.: WO2007/105886
PCT Pub. Date: Sep. 20, 2007

(65) Prior Publication Data

US 2009/0096780 A1 Apr. 16, 2009

(30) Foreign Application Priority Data

Mar. 10, 2006 (KR) ........................ 10-2006-0022556

(51) Int. Cl.
*G09G 5/00* (2006.01)
*H05K 1/00* (2006.01)

(52) U.S. Cl.
USPC ........................................... 345/214; 345/520

(58) Field of Classification Search
USPC ........................................................... 345/214
See application file for complete search history.

(56) References Cited

U.S. PATENT DOCUMENTS 4,281,323 A * 7/1981 Burnett et al. ................ 345/174
4,291,240 A * 9/1981 Rosler ........................... 327/259
5,757,353 A * 5/1998 Yokota et al. ................. 345/685
5,835,498 A * 11/1998 Kim et al. ..................... 370/537
6,151,334 A * 11/2000 Kim et al. ..................... 370/468
6,480,180 B1 * 11/2002 Moon ............................. 345/98
6,836,268 B1 * 12/2004 Song ............................. 345/204
6,947,034 B2 * 9/2005 Kwon ............................ 345/204
7,271,808 B2 * 9/2007 Moriyama et al. ............ 345/543
7,518,600 B2 * 4/2009 Lee ............................... 345/204

(Continued)

FOREIGN PATENT DOCUMENTS

KR 10-1999-0043608 6/1999
KR 10-2001-0105696 11/2001

OTHER PUBLICATIONS

"MOS Integrated Circuit uPD161801" Apr. 2003, NEC Electronics Corporation, Japan, XP002554721.

(Continued)

*Primary Examiner* — Alexander S Beck
*Assistant Examiner* — Mihir Rayan
(74) *Attorney, Agent, or Firm* — Birch, Stewart, Kolasch & Birch, LLP

(57) ABSTRACT

Provided is an interface apparatus. The interface apparatus comprises a signal synthesizer, a connector, and a signal separator. The signal synthesizer outputs at least one of display signals, display control signals, and chip control signals. The connector includes a transmission line connected with the signal synthesizer and through which the display signals and the chip control signals are transmitted in common, and a transmission line through which the display control signals are transmitted. The signal separator separates the display signals and chip control signals from the signals transmitted through the transmission line through which the display signals and the chip control signals are transmitted in common.

14 Claims, 2 Drawing Sheets

(56) References Cited

U.S. PATENT DOCUMENTS

| | | | | |
|---|---|---|---|---|
| 2001/0013849 | A1* | 8/2001 | Furukoshi | 345/87 |
| 2002/0011998 | A1* | 1/2002 | Tamura | 345/204 |
| 2002/0055792 | A1* | 5/2002 | Lee | 700/83 |
| 2002/0149542 | A1* | 10/2002 | Song | 345/3.3 |
| 2004/0125068 | A1* | 7/2004 | Lee | 345/99 |
| 2004/0212580 | A1 | 10/2004 | Kim | |
| 2004/0257322 | A1* | 12/2004 | Moon | 345/87 |
| 2005/0093819 | A1* | 5/2005 | Wang | 345/156 |
| 2007/0103413 | A1* | 5/2007 | Yang et al. | 345/87 |
| 2007/0285394 | A1* | 12/2007 | Lee et al. | 345/168 |
| 2008/0266221 | A1* | 10/2008 | Hong et al. | 345/87 |

OTHER PUBLICATIONS

"MOS Integrated Circuit uPD161703 for PMDS" Mar. 2005, NEC Electronics Corporation, Japan, XP002554722.

* cited by examiner

INTERFACE APPARATUS AND METHOD THEREOF

CROSS-REFERENCE TO RELATED APPLICATION

This application is the U.S. national stage application of International Patent Application No. PCT/KR2007/001176, filed Mar. 9, 2007, the disclosure of which is hereby incorporated by reference in its entirety.

TECHNICAL FIELD

The embodiment provides an interface apparatus and a method thereof.

BACKGROUND ART

As miniaturization of a multimedia reproducing apparatus is rapidly proceeded, a high quality display device is being mounted also in a mobile communication terminal having a multimedia reproduction function, and miniaturization of parts related to a display function also emerges as a crucial factor.

An interface apparatus should be provided between a control module and a display module to allow the display module to display electric signals containing multimedia data. A related art interface apparatus includes an interface apparatus for delivering image signals and an interface apparatus for delivering chip control signals, so that the number of pins for connection increases.

Therefore, since the interface apparatus requires a separate transmission line for transmitting chip control signals, it becomes an obstacle in miniaturization of a multimedia reproducing apparatus, and increases manufacturing costs.

FIG. 1 is a view explaining an interface apparatus provided to a display device.

Referring to FIG. 1, the display device includes a central processor 12, a timing controller and signal converter 14, a decoder 16, and an interface apparatus 10 for connecting the central processor 12, the timing controller and signal converter 14, and the decoder 16.

The central processor 12 transmits received data in the form of image signals and chip control signals in order to drive a display module, and controls respective elements of the display device.

The image signals include display signals and display control signals.

The display signals include red (R), green (G), and blue (B) signals. The display control signals include horizontal synchronization input (Hsync) signals, vertical synchronization input (Vsync) signals, data enable (DE) signals, and data clock (DCLK) signals. The chip control signals include chip select (CS) signals, serial clock (SCK) signals, serial data input (SDI) signals, and serial data output (SDO) signals.

The timing controller and signal converter 14 converts the display signals into analog signals when outputting display signals received from the central processor 12 to the display module, and controls the orders and positions of display signals output to the display module according to the display control signals, i.e., the Hsync signals, Vsync signals, DE signals, and DCLK signals.

For example, display control signals can be signals for informing polarities in order to drive the display module in a positive polarity (+) or negative polarity (−), a signal for informing a start point (a point at which a first pixel is designated) of data, or signals for controlling an internal power sequence.

The decoder 16 decodes CS signals, SCK signals, and SDI signals delivered from the central processor 12 to deliver the same to the display module, and delivers decoding results and SDO signals requesting necessary data from the display module to the central processor 12. Here, the SDO signals may not be used depending on the kind of the display device.

The interface apparatus 10 includes a plurality of transmission lines.

R, G, and B signals, which are display signals, have a data size of 6 bit, respectively, in the case where they have a RGB666 format, and are transmitted in parallel via corresponding transmission lines but the chip control signals are transmitted in series.

As described above, the interface apparatus 10 provided to the display device transmits display signals, display control signals, and chip control signals via corresponding transmission lines.

Therefore, lots of transmission lines for connecting the central processor 12, the timing controller and signal converter 14, and the decoder 16 are required.

Also, since the interface apparatus for transmitting chip control signals adopts a serial transmission method, a speed in which chip control signals are transmitted is slow, which slows down an overall operating speed of the display device.

DISCLOSURE OF INVENTION

Technical Problem

An embodiment provides an interface apparatus and a method thereof capable of transmitting signals between a control module and a display module.

Another embodiment provides an interface apparatus and a method thereof capable of transmitting various kinds of signals via a minimum number of transmission lines.

Still another embodiment provides an interface apparatus and a method thereof capable of transmitting chip control signals in fast speed.

Technical Solution

The embodiment provides an interface apparatus comprising: a signal synthesizer for outputting at least one of display signals, display control signals, and chip control signals; a connector including a transmission line connected with the signal synthesizer and through which the display signals and the chip control signals are transmitted in common, and a transmission line through which the display control signals are transmitted; and a signal separator for separating the display signals and chip control signals from the signals transmitted through the transmission line through which the display signals and the chip control signals are transmitted in common.

The embodiment provides an interface apparatus comprising: a signal synthesizer for outputting at leas one of display signals, display control signals, and chip control signals, and selectively outputting the display signals and the chip control signals in response to the display control signals; a connector including a transmission line connected with the signal synthesizer and through which at least the display signals and the chip control signals are transmitted in common; and a signal separator for separating the display signals and chip control signals from the signals transmitted through the transmission line through which the display signals and the chip control signals are transmitted in common.

The embodiment provides an interface method comprising: inputting display signals, display control signals, and chip control signals to a signal synthesizer; outputting the display control signals to a connector, and selectively outputting the display signals and the chip control signals in response to the display control signals; and separating, at a signal separator connected with the connector, the display signals and the chip control signals in response to the display control signals.

Advantageous Effects

According to the embodiment, an interface apparatus can be realized in a small size.

According to the embodiment, display signals and chip control signals can be transmitted via the same transmission line.

According to the embodiment, chip control signals can be transmitted in fast speed.

MODE FOR THE INVENTION

Reference will now be made in detail to the preferred embodiments of the present invention, examples of which are illustrated in the accompanying drawings. The embodiments exemplify that an interface apparatus is applied to a mobile communication terminal.

Figure 1:
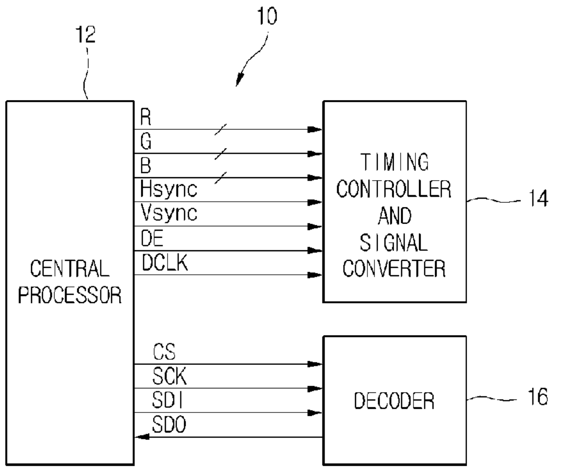
FIG. 1 is a view explaining an interface apparatus provided to a display device.
Figure 2:
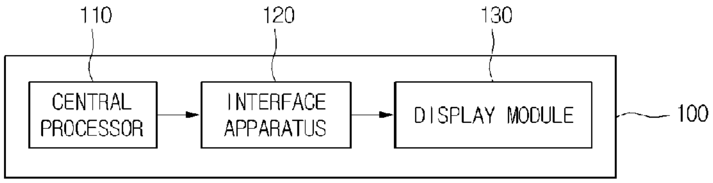
FIG. 2 is a view explaining a mobile communication terminal according to an embodiment.

FIG. 2 is a view explaining a mobile communication terminal according to an embodiment.

Referring to FIG. 2, the mobile communication terminal 100 includes a central processor 110, an interface apparatus 120, and a display module 130.

The central processor 110 transmits signals required for driving the display module 130 to the display module 130 via the interface apparatus 120, and controls other functions of the mobile communication terminal 100.

The interface apparatus 120 allows data transmission between the central processor 110 and the display module 130. In an embodiment, the interface apparatus 120 receives display signals, display control signals, and chip control signals from the central processor 110, and outputs the received signals to the display module 130.

The display module 130 converts electrical signals containing multimedia data into displayable signals and displays the converted signals. The display module 130 includes a display unit including a liquid crystal display (LCD) device, light emitting diodes (LED), and organic light emitting diodes (OLED), and a signal processing unit for allowing multimedia data to be displayed on the display unit.

The signal processing unit can include a timing controller and signal converter, and a decoder.

According to an embodiment, the interface apparatus 120 has a minimum number of transmission lines, and transmits display signals, display control signals, and chip control signals.

That is, according to an embodiment, since the chip control signals are transmitted through a transmission line through which the display signals are transmitted during a time section where the display signals are not transmitted, a separate signal line for transmitting chip control signals is not required.

Figure 3:
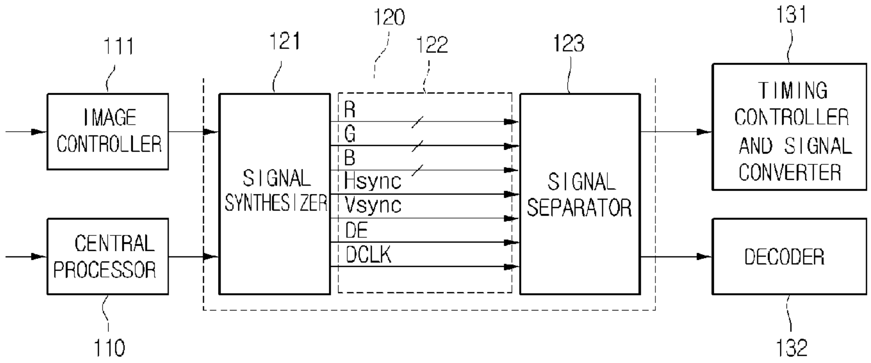
FIG. 3 is a view explaining an interface apparatus according to an embodiment.

FIG. 3 is a view explaining an interface apparatus according to an embodiment.

Referring to FIG. 3, the interface apparatus 120 includes a signal synthesizer 121, a connector 122, and a signal separator 123.

The signal synthesizer 121 is connected to an image controller 111 and a central processor 110. For example, the image controller 111 can be a graphic card.

The signal synthesizer 121 receives display signals and display control signals from the image controller 111, and receives chip control signals from the central processor 110.

According to another embodiment, the image controller 111 is connected to the central processor 110, and the central processor 110 can be connected to the signal synthesizer 121. According to still another embodiment, the central processor 110 is connected to the image controller 111, and the image controller 111 can be connected to the signal synthesizer 121.

The signal separator 123 is connected to a timing controller and signal converter 131 and a decoder 132.

The connector 122 has a plurality of transmission lines and allows display signals, display control signals, and chip control signals to be transmitted.

The display signals are signals constituting pixels of the display module 130, and can be R, G, and B signals.

The display control signals are control signals allowing the display signals to the displayed on the display module 130, and can be Hsync signals, Vsync signals, DE signals, and DCLK signals, for example.

The chip control signals are signals for controlling a chip provided to the display module 130, and can be CS signals, SCK signals, and SDI signals.

In an embodiment, the connector 122 includes a transmission line for transmitting the display signals and a transmission line for transmitting the display control signals.

Also, not only the display signals but also the chip control signals are transmitted through the transmitting line for transmitting the display signals.

That is, in an embodiment, the chip control signals are not transmitted during a time section where the display signals are transmitted, but transmitted during a time section where the display signals are not transmitted.

Meanwhile, the display signals can be transmitted using a parallel transmission method, and the chip control signals can be converted using the parallel transmission method. In this case, chip control signals are transmitted in faster speed than that of a serial transmission method.

Figure 4:
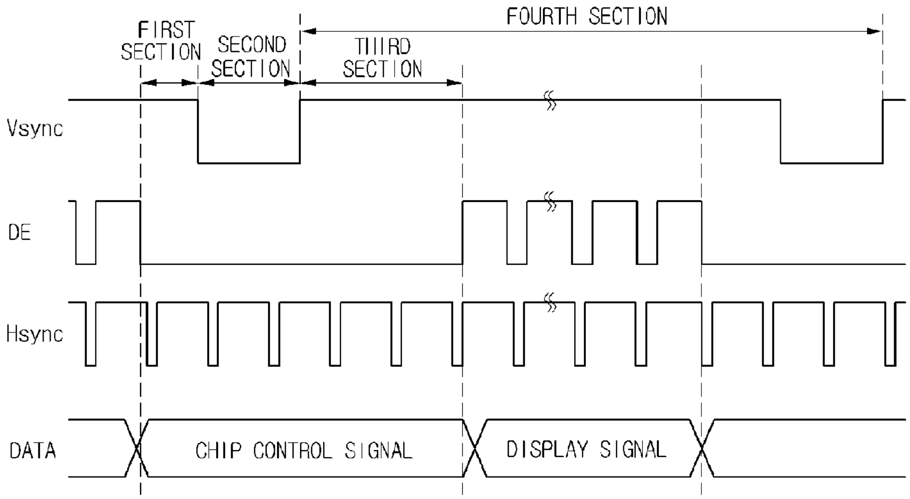
FIG. 4 is a timing diagram explaining a display signal, a display control signal, and a chip control signal of an interface apparatus according to an embodiment are transmitted.

FIG. 4 is a timing diagram explaining a display signal, a display control signal, and a chip control signal of an interface apparatus according to an embodiment are transmitted.

Referring to FIG. 4, Vsync signals, DE signals, and Hsync signals are shown as display control signals.

A first section is a vertical front porch section, a second section is a vertical synchronization width section, a third section is a vertical back porch section, and a fourth section is a vertical total section.

The vertical front porch section means a section from a falling edge of a last enable signal of a DE signal to a start point of a vertical synchronization width section. The vertical back porch section means a section from a last point of the vertical synchronization width section to a rising edge of a DE signal. The vertical total section means one period of the vertical synchronization signal.

The DE signal is synchronized with a rising edge of a clock pulse signal of an Hsync signal. The display signal is transmitted in a section where a DE signal is enabled. Also, the chip control signal is transmitted in a section where a DE signal is disabled, i.e., the first, second, and third sections.

That is, in an embodiment, the signal synthesizer 121 transmits display signals and chip control signals through the same transmission line, and transmits the display signals and the chip control signals in turns by dividing a time section.

The signal separator 123 separates display signals and chip control signals transmitted through the same transmission line. The display signals are converted into analog signals by the timing controller and signal converter 131, and output through a display unit. The chip control signals are decoded and processed by the decoder 132.

The signal synthesizer 121 selectively transmits the display signals and the chip control signals in response to the display control signals. The signal separator 123 separates the display signals and the chip control signals in response to the display control signals.

Figure 5:
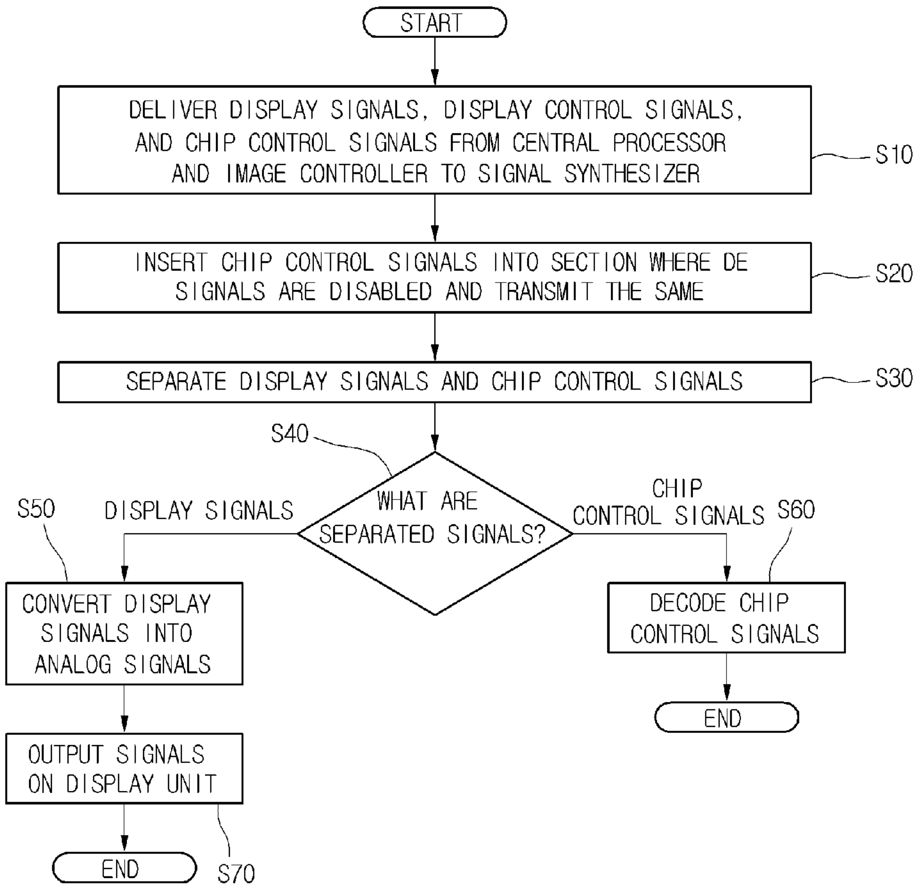
FIG. 5 is a flowchart explaining an interface method according to an embodiment.

FIG. 5 is a flowchart explaining an interface method according to an embodiment.

Display signals and display control signals are transmitted from the image controller 111 to the signal synthesizer 121. Chip control signals are transmitted from the central processor 110 to the signal synthesizer 121 (S10).

The signal synthesizer 121 inserts the chip control signals into a section where a DE signal is disabled and transmits the chip control signals (S20).

That is, when the DE signal is in an enable section, the signal synthesizer 121 transmits display signals. When the DE signal is in a disable section, the signal synthesizer 121 transmits chip control signals (S20).

Meanwhile, the signal separator 123 separates the chip control signals and the display signals as respective signals (S30).

When the display signals and the chip control signals are separated as the respective signals, the separated signals are converted into analog signals when they are display signals (S40 and S50) and outputs through the display unit (S70).

Also, when the separated signals are chip control signals, they are decoded (S40 and S60).

INDUSTRIAL APPLICABILITY

Embodiments can be applied to a display device.

The invention claimed is:

1. An interface apparatus comprising:

a signal synthesizer for outputting at least one of display signals, display control signals, and chip control signals;

a connector including a first transmission line connected with the signal synthesizer and for sequentially transmitting the chip control signals and the display signals, and a second transmission line for transmitting the display control signals; and a signal separator for separating the display signals and the chip control signals from the first transmission line, wherein the signal synthesizer outputs the chip control signals to the first transmission line for a first period and outputs the display signals to the first transmission line for a second period under a control of the display control signals, wherein the signal synthesizer outputs the display signals and the chip control signals in turn, wherein the chip control signals comprise chip select signals, serial clock signals, and serial data input signals, wherein the signal separator outputs the display signal to a timing controller and signal converter, wherein the display control signals comprises horizontal synchronized input signals, vertical synchronized input signals, data enable signals, and data clock signals, and wherein the first period is a section when the data enable signals is disabled.

2. The interface apparatus according to claim 1, wherein the signal synthesizer sequentially outputs the display signals and the chip control signals according to a time division.

3. The interface apparatus according to claim 1, wherein the first transmission line is a parallel transmission line.

4. The interface apparatus according to claim 1, wherein the display signals are signals constituting pixels of a display module.

5. The interface apparatus according to claim 1, wherein the display signals are red, green, and blue signals.

6. The interface apparatus according to claim 1, wherein the display control signals are signals for controlling the display signals to be displayed on a display module.

7. The interface apparatus according to claim 1, wherein the chip control signals are signals for controlling a chip provided to a display module.

8. The interface apparatus according to claim 1, wherein the signal separator is connected to the timing controller and signal converter to transmit the display signals and the display control signals, and connected to a decoder to transmit the chip control signals.

9. The interface apparatus according to claim 1, wherein the second period is a section when the data enable signals is enabled.

10. The interface apparatus according to claim 1, wherein the signal separator separates the display signals and the chip control signals from the first transmission line under the control of the display control signals.

11. An interface method comprising:

inputting display signals, display control signals, and chip control signals to a signal synthesizer;

outputting, at the signal synthesizer, the chip control signals to a first transmission line for a first period under the control of the display control signals;

outputting, at the signal synthesizer, the display signals to the first transmission line for a second period under the control of the display control signals;

outputting, at the signal synthesizer, the display control signals to a second transmission line; and separating, at a signal separator connected with the first transmission line, the chip control signals and the display signals from the first transmission line under the control of the display control signals, wherein the signal synthesizer outputs the display signals and the chip control signals in turns, wherein the chip control signals comprise chip select signals, serial clock signals, and serial data input signals, wherein the signal separator outputs the display signal to a timing controller and signal converter, wherein the display control signals comprises horizontal synchronized input signals, vertical synchronized input signals, data enable signals, and data clock signals, and wherein the first period is a section when the data enable signals is disabled.

12. The method according to claim 11, wherein the display signals are signals constituting pixels of a display module.

13. The method according to claim 11, wherein the display control signals are signals for controlling the display signals to be displayed on a display module.

14. The method according to claim 11, wherein the chip control signals are signals for controlling a chip provided to a display module.

* * * * *